(12) United States Patent
Huang et al.

(10) Patent No.: US 7,794,118 B2
(45) Date of Patent: Sep. 14, 2010

(54) LIGHT EMITTING DIODE ASSEMBLY

(75) Inventors: Chung-Yuan Huang, Santa Clara, CA (US); Jer-Haur Kuo, Taipei Hsien (TW); Xin-Xiang Zha, Shenzhen (CN); Ye-Fei Yu, Shenzhen (CN); Lin Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 147 days.

(21) Appl. No.: 12/133,398

(22) Filed: Jun. 5, 2008

(65) Prior Publication Data

US 2009/0237956 A1    Sep. 24, 2009

(30) Foreign Application Priority Data

Mar. 19, 2008    (CN) .................. 2008 1 0066122

(51) Int. Cl.
*F21V 5/02*    (2006.01)
(52) U.S. Cl. .................. 362/336; 362/310; 362/311.02; 362/311.06; 362/311.15; 362/800
(58) Field of Classification Search .................. 362/310, 362/311.01, 311.02, 311.06, 311.15, 326, 362/332, 336, 327; 359/742, 743
See application file for complete search history.

(56) References Cited

U.S. PATENT DOCUMENTS

| | | | | |
|---|---|---|---|---|
| 4,371,916 A | * | 2/1983 | De Martino | 362/511 |
| 5,742,120 A | * | 4/1998 | Lin | 313/512 |
| 6,598,998 B2 | * | 7/2003 | West et al. | 362/307 |
| 6,607,286 B2 | * | 8/2003 | West et al. | 362/255 |
| 6,679,621 B2 | * | 1/2004 | West et al. | 362/327 |
| 7,201,503 B2 | * | 4/2007 | Amano et al. | 362/522 |
| 7,438,444 B2 | * | 10/2008 | Pao et al. | 362/327 |
| 2008/0037116 A1 | * | 2/2008 | Alasaarela et al. | 359/433 |
| 2008/0247173 A1 | * | 10/2008 | Danek et al. | 362/309 |
| 2009/0194778 A1 | * | 8/2009 | Huang et al. | 257/98 |

* cited by examiner

*Primary Examiner*—Jong-Suk (James) Lee
*Assistant Examiner*—Leah S Lovell
(74) *Attorney, Agent, or Firm*—Frank R. Niranjan (57) ABSTRACT

An LED assembly (10) includes an LED (12) and a lens (16). The lens covers on an outer periphery of the LED. The LED has an encapsulant (125) and an LED chip (121) received in the encapsulant (125) and having a light emitting surface (122). The lens has a light output surface (161) over the light emitting surface. The light output surface defines a plurality of annular, concentric grooves (163). Each groove (163) is cooperatively enclosed by a first groove wall (165) and a second groove wall (166). The first groove wall is a portion of a periphery of an imaginary cone and a conical tip of the imaginary cone is located on the light emitting surface of the LED chip.

13 Claims, 7 Drawing Sheets

LIGHT EMITTING DIODE ASSEMBLY

BACKGROUND

1. Technical Field

The present invention relates generally to a light emitting diode (LED) assembly, and particularly to a lens of a light emitting diode assembly, which can improve the radiation pattern and illumination of the light emitted from an LED of the LED assembly.

2. Description of Related Art

With the continuing development of scientific technology, light emitting diodes have been widely used in the illumination field due to their high brightness, long life-span, and wide color gamut.

Generally, in use, a light emitting diode is assembled with a lens to form an LED assembly, wherein the lens covers the LED. The LED includes a base, an LED chip mounted on the base and an encapsulant encapsulating the LED chip therein. The lens has a smoothly dome-shaped outer surface as a light output surface. In operation of the light emitting diode assembly, lights emitted from the LED emit towards the light output surface, then refracted by the light output surface and finally spread out of the lens along different directions.

In the conventional light emitting diode assembly, the lights are directly refracted by the light output surface, whose smooth nature can not help the emitted lights to be concentrated to a smaller area to satisfy a high-brightness requirement, or can not help the emitted light to be dispersed to a larger area to satisfy a large-area illumination requirement.

What is needed, therefore, is a light emitting diode assembly, which can overcome the above-mentioned disadvantages.

SUMMARY

An LED assembly includes an LED and a lens. The lens covers on an outer periphery of the LED. The LED has an encapsulant and an LED chip having a light emitting surface and received in the encapsulant. The lens has a light output surface over the light emitting surface. The light output surface defines a plurality of annular, concentric grooves. Each groove is cooperatively enclosed by a first groove wall and a second groove wall. The first groove wall is a portion of a circumferential side surface of an imaginary cone, and a conical tip of the imaginary cone is located on the light emitting surface of the LED chip.

Other advantages and novel features of the present invention will become more apparent from the following detailed description when taken in conjunction with the accompanying drawings.

BRIEF DESCRIPTION OF THE DRAWINGS

Many aspects of the present light emitting diode assembly can be better understood with reference to the following drawings. The components in the drawings are not necessarily drawn to scale, the emphasis instead being placed upon clearly illustrating the principles of the present light emitting diode assembly. Moreover, in the drawings, like reference numerals designate corresponding parts throughout the several views.

DETAILED DESCRIPTION

Figure 1:
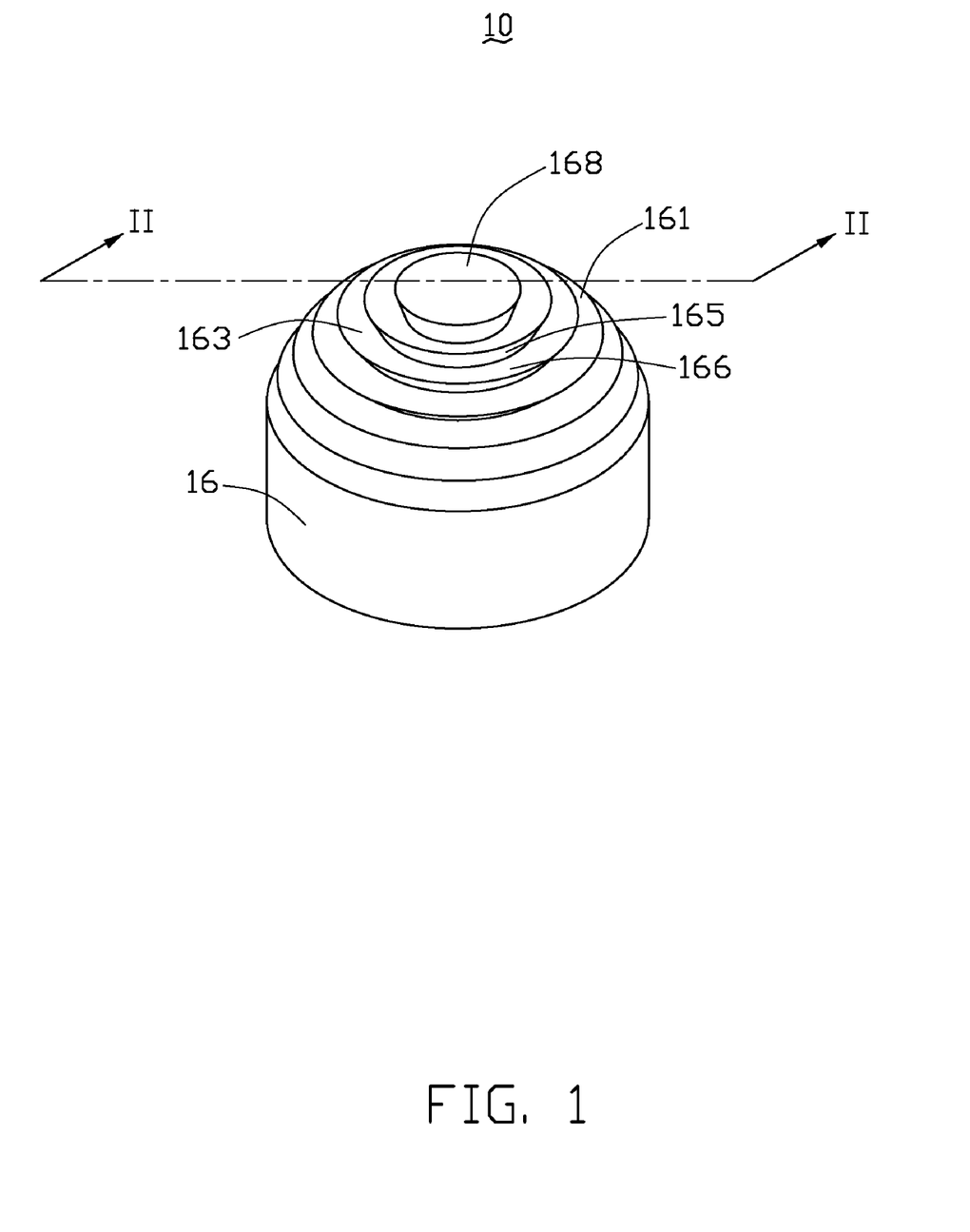
FIG. 1 is an assembled, isometric view of a light emitting diode assembly in accordance with a first preferred embodiment of the present invention.
Figure 2:
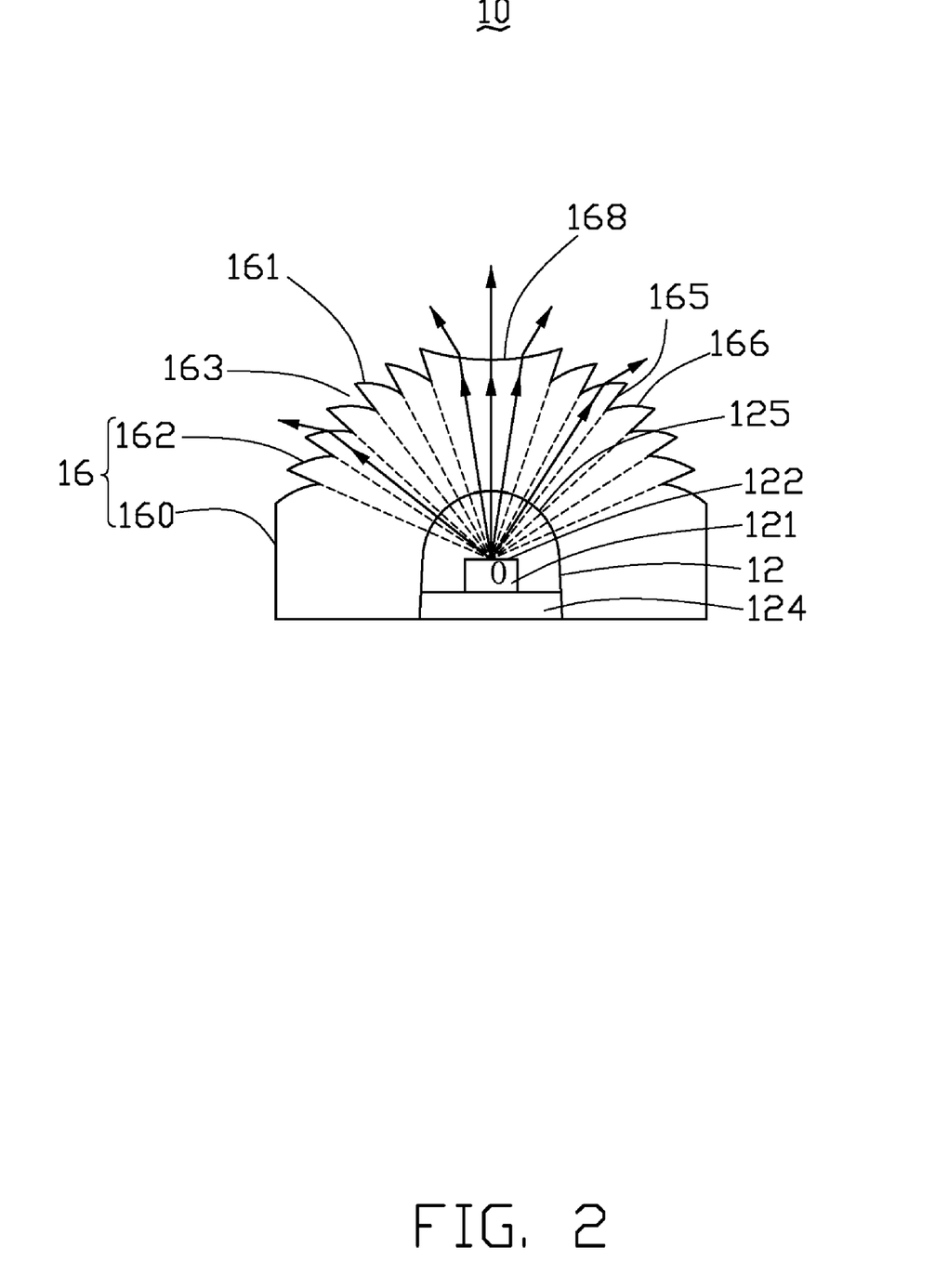
FIG. 2 is a schematic view of a cross section of the light emitting diode assembly shown in FIG. 1, along a line II-II.

Referring to FIGS. 1 and 2, an LED assembly 10 in accordance with a first preferred embodiment of the present invention includes an LED 12 and a lens 16. The LED 12 is for use in an illumination lamp. The lens 16 that covers on an outer surface of the LED 12 is used for conducting lights emitted by the LED 12.

The LED 12 is an SMT (surface-mounting technology) type LED. The LED 12 includes an LED chip 121, a base 124 and an encapsulant 125. The base 124 electrically connects with a printed circuit board (not shown). The LED chip 121 is attached to a top surface of the base 124. The encapsulant 125 covers on an outer periphery of the LED chip 121 for hermitically sealing the LED chip 121 from being corroded by the outside environment. The encapsulant 125 is made of a transparent material, such as epoxy resin, silicone, PMMA (polymethyl methacrylate) and so on. The LED chip 121 has a light emitting surface 122 for emitting light. The light passes through the encapsulant 125 to enter the lens 16. The encapsulant 125 also provides a sufficient heat transferring path for the LED chip 121, which prevents the LED chip 121 from overheating during operation.

The lens 16 is made of a transparent material, such as epoxy resin, silicone, PMMA (polymethyl methacrylate) and so on. The lens 16 covers on an outer periphery of the LED 12 for conducting lights of the LED 12 outwardly toward predetermined directions. The lens 16 has a bullet shape. The lens 16 has a lower portion 160 and an upper portion 162. The lens 16 has a light output surface 161 at the upper portion 162 thereof. The light output surface 161 is generally dome-shaped. The light output surface 161 defines a plurality of annular, concentric grooves 163 each of which extends along a circumferential direction thereof. Each groove 163 is cooperatively enclosed by an upper groove wall 165 and a lower groove wall 166.

The upper groove wall 165 has a configuration of a straight line as viewed from FIG. 2, whilst the lower groove wall 166 has a configuration of a curved line. A diameter defined by the upper groove wall 165 gradually decreases along a top-to-bottom direction. In other words, the upper groove wall 165 is a portion of a circumferential side surface of an imaginary cone. A conical tip of the imaginary cone is located on the light emitting surface 122 of the LED chip 121. Specially, the conical tip of the imaginary cone is preferably located at a central point O of the light emitting surface 122 of the LED chip 121.

As viewed from FIG. 2, an extension line (i.e., dotted line) of the upper groove wall 165 extends through the central point O of the light emitting surface 122 of the LED chip 121. The lower groove wall 166 is a convex flaring outward from a bottom end of the upper groove wall 165. A diameter defined by the lower groove wall 166 gradually increases from an innermost end of the lower groove wall 166, which locates adjacent to the upper groove wall 165 of each groove 163, towards an outmost end thereof, which locates adjacent to the upper groove wall 165 of an adjacent lower groove 163. Specially, a concave portion 168 is defined in a top end of the light output surface 161. The concave portion 168 has a smooth, continual surface which is curved downwardly.

When the LED assembly 10 operates, lights emitted from the LED chip 121 travel in the lens 16 and towards the light output surface 161. The lights arrived at the light output surface 161 are refracted and pass through the lower groove walls 166, and then change their original directions to emit outwardly, whereby the LED assembly 10 can disperse light. Therefore, the lights emitted from the LED assembly 10 can be dispersed to a larger light receiving surface than the conventional LED assembly.

Furthermore, in the LED assembly 10, the conical tip of the imaginary cone defined by the upper groove wall 165 is located at the central point O of the light emitting surface 122 of the LED chip 121. According to rectilinear propagation of light, light emitting along the line of the upper groove wall 165 can directly pass through the light output surface 161 without reflecting. Thus, the LED assembly 10 can prevent the lights from leaking out from the upper groove wall 165 as much as possible so as to decrease the wastage of the lights and accordingly improving illumination of the LED. Furthermore, it is proved by computer simulation that the concave portion 168 results in a similar light-dispersion effect to the grooves 163 supposed to be defined in the top end of the light output surface 161. Furthermore, to form the concave portion 168 instead of the grooves 163 in the top end of the light output surface 161 can save cost and time for manufacturing the lens 16.

Figure 3:
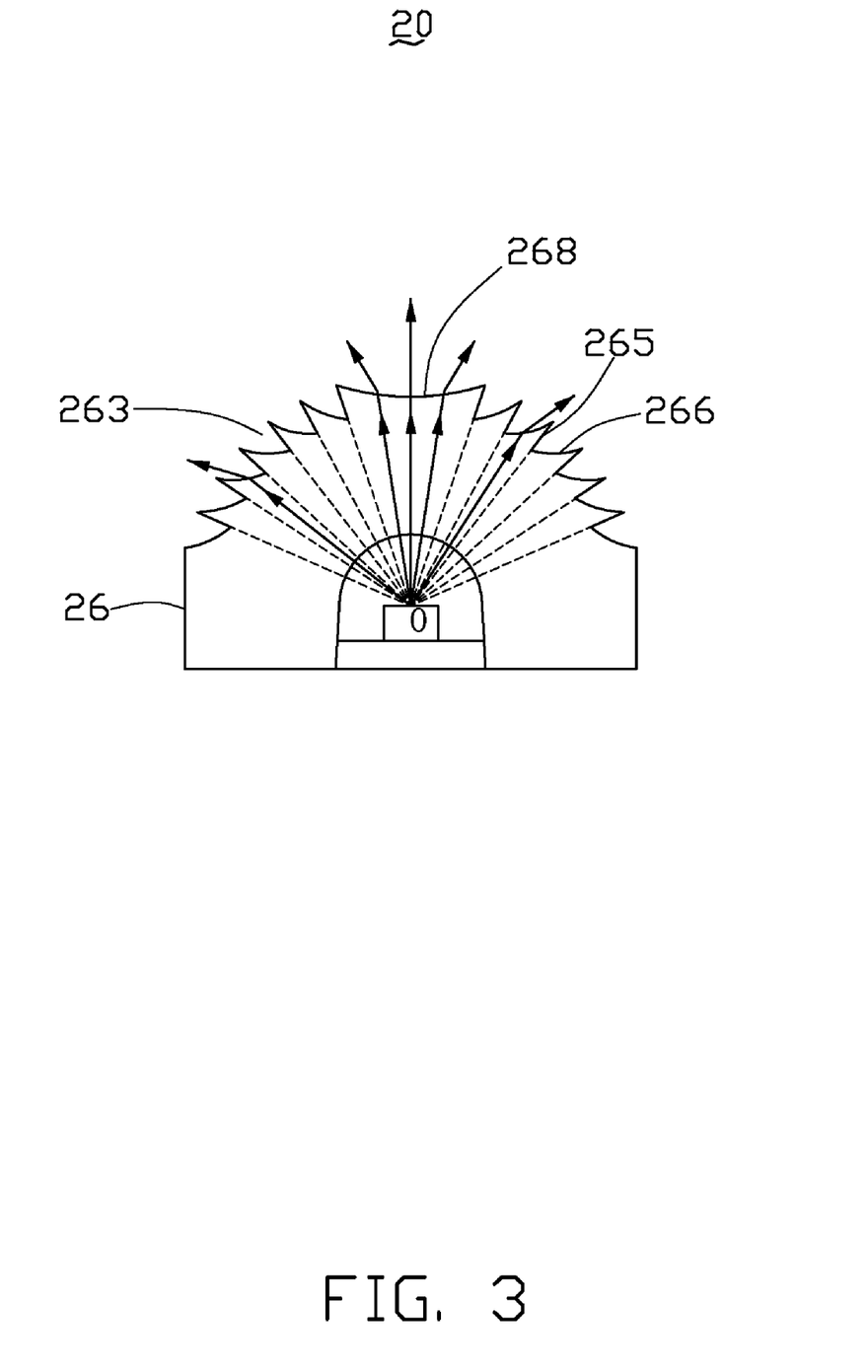
FIG. 3 is a schematic view of a cross section of a light emitting diode assembly in accordance with a second preferred embodiment of the present invention.

Alternatively, the lower groove wall 166 of each groove 163 in the LED assembly 10 can be other shapes. Referring to the LED assembly 20 shown in FIG. 3, the lower groove wall 266 of each groove 263 has a concave configuration extending outwardly from a bottom end of a corresponding upper groove wall 165. A diameter defined by the lower groove wall 266 gradually increases from an innermost end, which locates adjacent to the upper groove wall 265 of each groove 263, towards an outmost end thereof, which locates adjacent to the upper groove wall 265 of an adjacent lower groove 263. The lens 26 has a concave portion 268 defined in a top thereof, which is similar to the concave portion 168.

Figure 4:
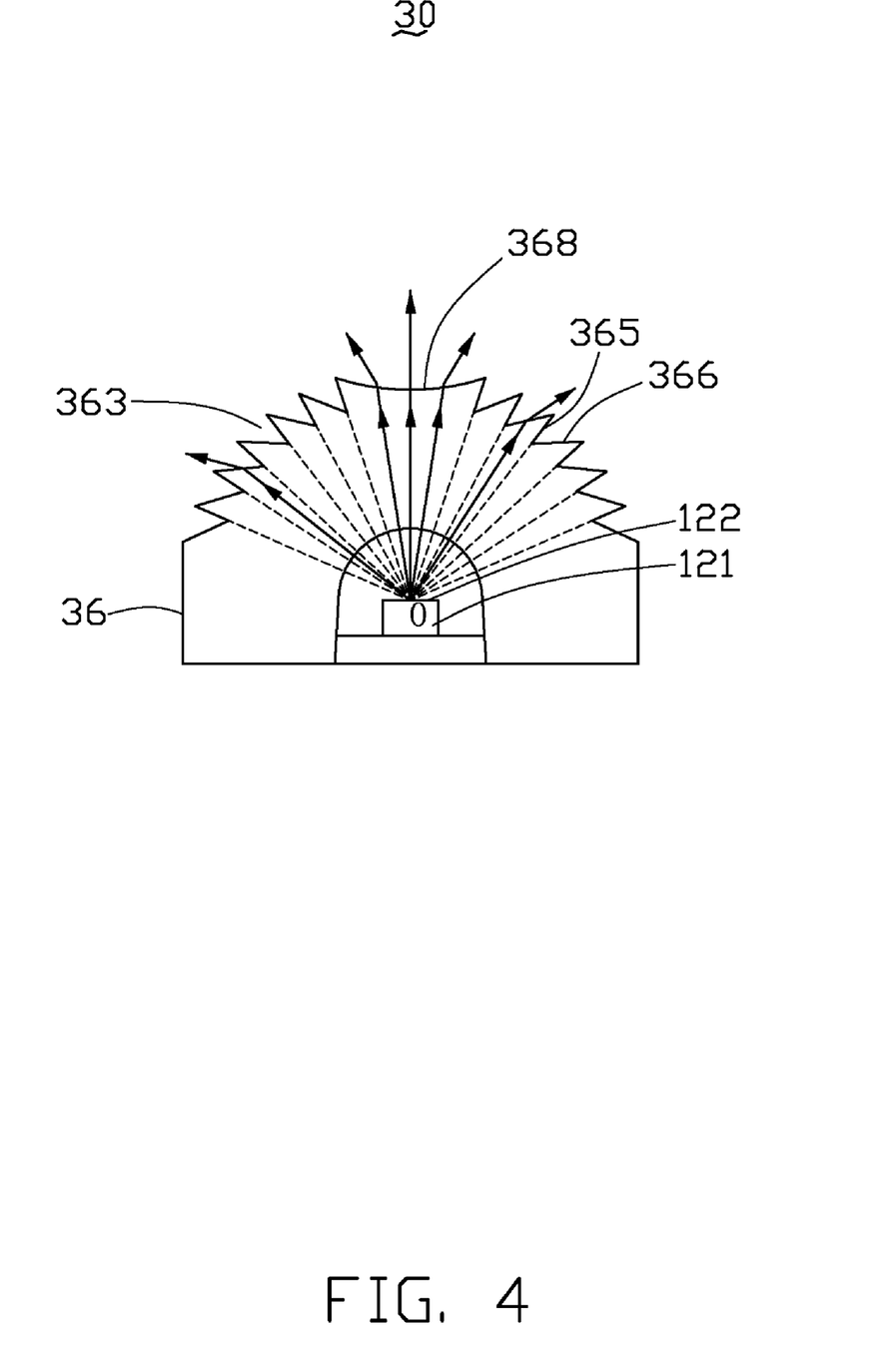
FIG. 4 is a schematic view of a cross section of a light emitting diode assembly in accordance with a third preferred embodiment of the present invention.

Referring to FIG. 4, in the LED assembly 30 according to third embodiment, the lower groove wall 366 of each groove 363 has a configuration of a straight line extending outwardly from a bottom end of a corresponding upper groove wall 365. A diameter defined by the lower groove wall 366 gradually increases from an innermost end, which locates adjacent to the upper groove wall 365 of each groove 363, towards an outermost end thereof, which locates adjacent to the top groove wall 365 of an adjacent lower groove 363. The lower groove wall 366 is a portion of a circumferential side surface of an imaginary cone. A conical tip of the imaginary cone is not located at the central point O of the light emitting surface 122 of the LED chip 121. The lens 36 has a concave portion 368 defined in a top thereof, which is similar to the concave portion 168.

Figure 5:
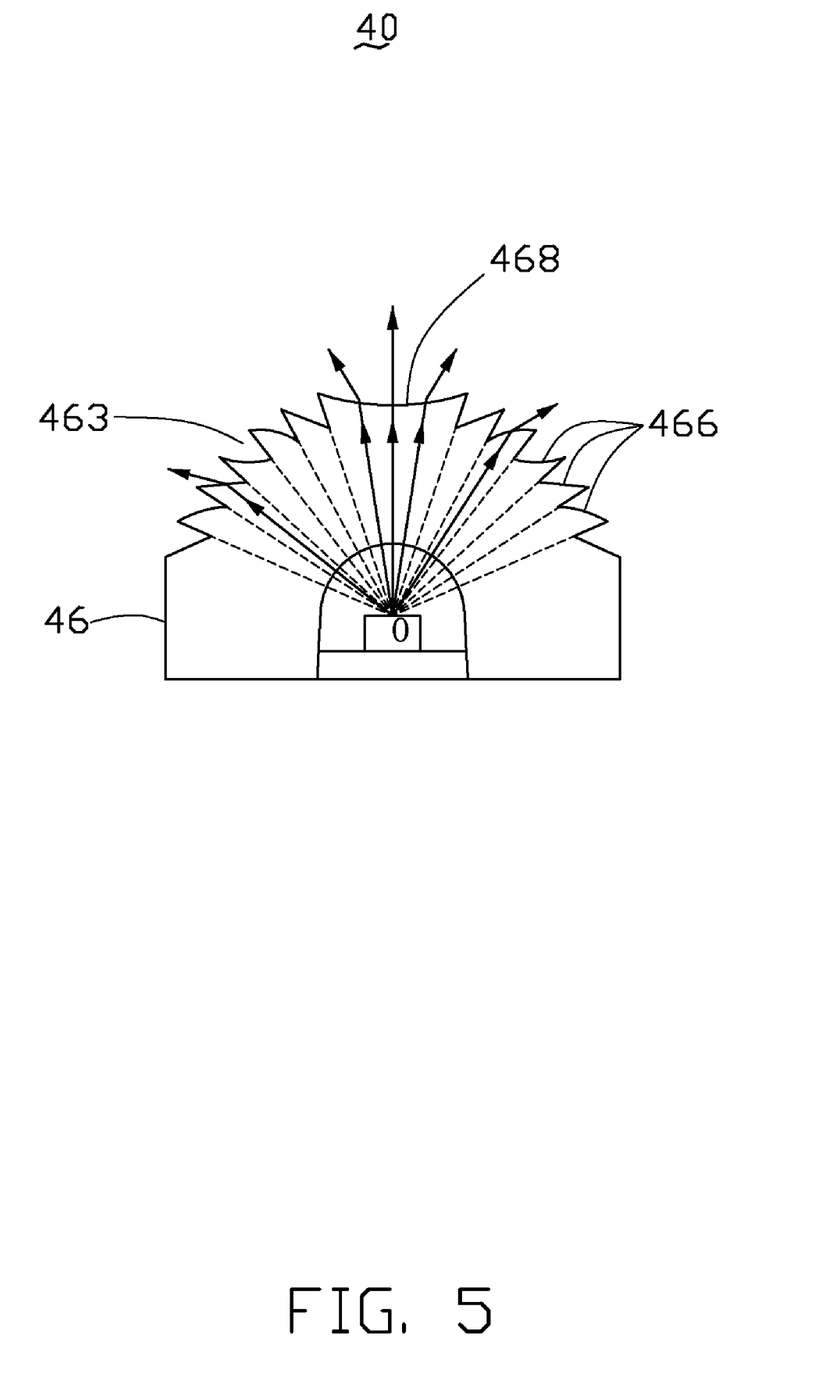
FIG. 5 is a schematic view of a cross section of a light emitting diode assembly in accordance with a fourth preferred embodiment of the present invention.

As shown in FIG. 5, the lower groove walls 466 of the grooves 463 of the LED assembly 40 in accordance with a fourth embodiment have three kinds of configurations in order along a radially outward direction, i.e., straight, concave and convex. The lens 46 has a concave portion 468 defined in a top thereof, which is similar to the concave portion 168.

Figure 6:
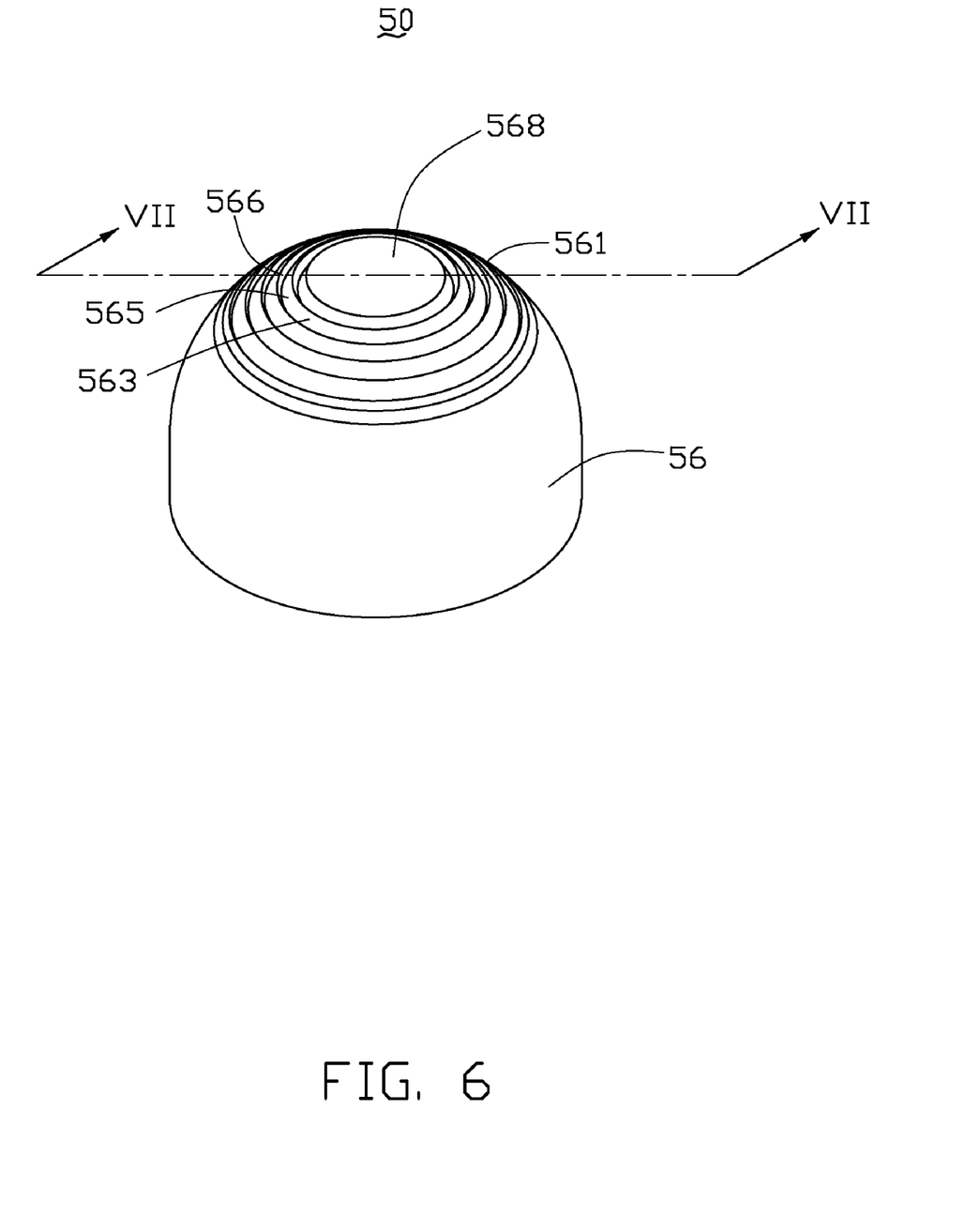
FIG. 6 is an assembled, isometric view of a light emitting diode assembly in accordance with a fifth preferred embodiment of the present invention.
Figure 7:
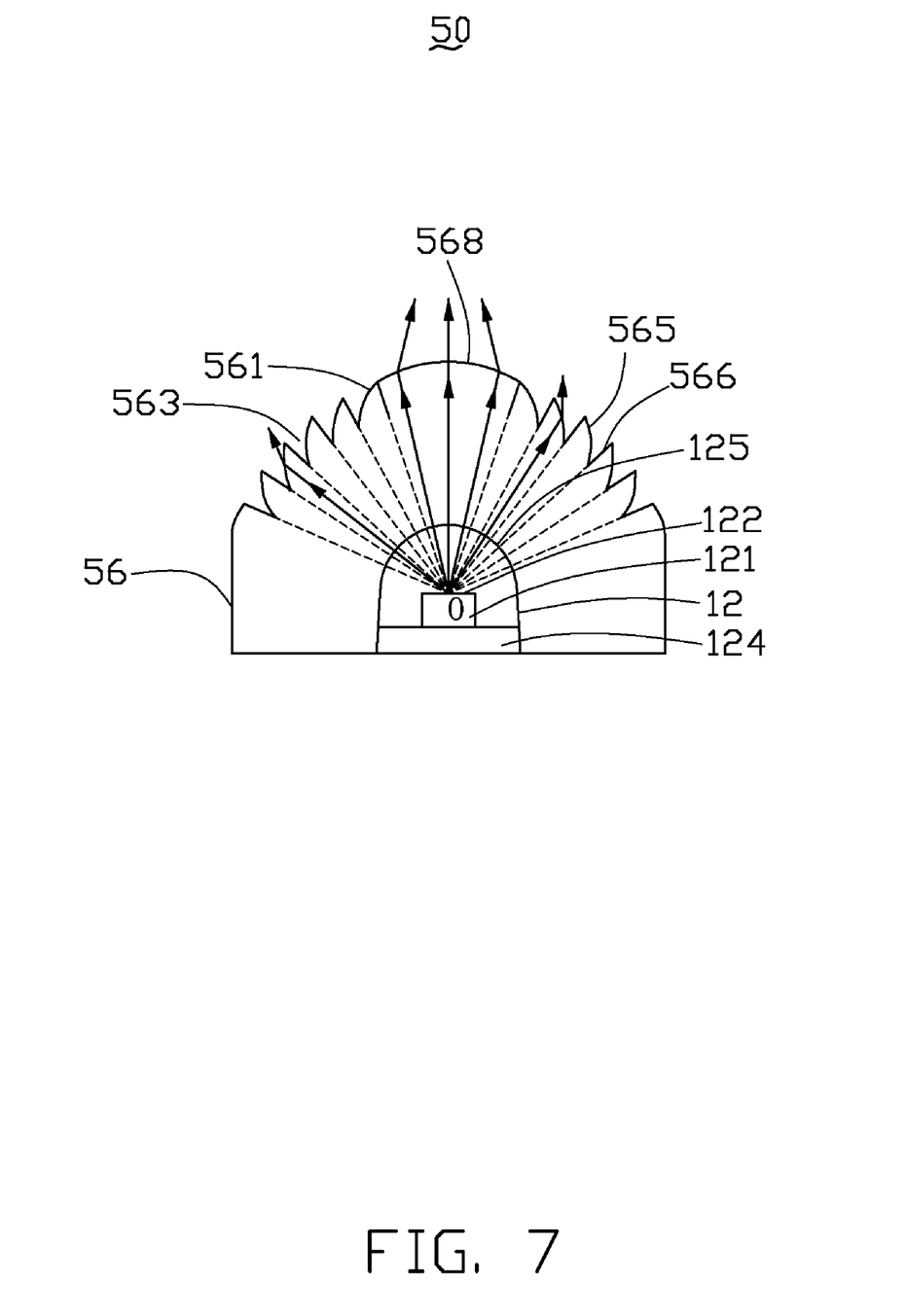
FIG. 7 is a schematic view of a cross section of the light emitting diode assembly shown in FIG. 6, along a line VII-VII.

Referring to FIGS. 6 and 7, an LED assembly 50 in accordance with a fifth preferred embodiment of the present invention is shown. In this embodiment, the upper groove wall 565 of each groove 563 has a configuration of a convex flaring out from a top end of a corresponding lower groove wall 566 of an adjacent upper groove 563, as viewed from FIG. 7. The lower groove wall 566 is a portion of a circumferential side surface of an imaginary cone. A conical tip of the imaginary cone is located on the light emitting surface 122 of the LED chip 121. Specially, the conical tip of the imaginary cone is preferably located at a central point O of the light emitting surface 122 of the LED chip 121. As a result, a diameter defined by the lower groove wall 566 gradually reduces from a top end towards a bottom end thereof. A diameter defined by the upper groove wall 565 gradually increases from an innermost end, which locates adjacent to the lower groove wall 566 of the adjacent upper groove 563, towards an outermost end thereof, which locates adjacent to the lower groove wall 566 of the groove 563.

Alternatively, the configuration of the upper groove wall 565 of each groove 563 can be other shaped, such as concave or straight. Specially, a convex portion 568 is formed in a top end of the light output surface 561. The convex portion 568 has a smooth, continual surface which is curved upwardly.

When the present LED assembly 50 operates, lights emitted from the LED 12 travel in the lens 56 and towards the light output surface 561. The lights arrived at the light output surface 561 are refracted and pass through the upper groove wall 565 of each groove 563, and then change their original directions to emit upwardly and inwardly, whereby the LED assembly 50 can be used to concentrate the generated lights. Therefore, the lights emitted from the LED assembly 50 can be concentrated to a smaller light receiving surface than the conventional light emitting diode, thus satisfying a pointing, indicating or spotting requirement. Furthermore, in the LED assembly 50, the conical tip of the imaginary cone defined by the lower groove wall 566 is located at the central point O of the light emitting surface 122 of the LED chip 121. According to rectilinear propagation of light, the LED assembly 50 can prevent the light from leaking out from the lower groove wall 566 as much as possible, thereby preventing the lights from being reflected by the lower groove wall 566, thus decreasing the wastage of the lights and accordingly improving illumination of the lights.

It is proved by computer simulation that the convex portion 568 results in a similar effect to the grooves 563 supposed to be defined in the top end of the light output surface 561. It is to be understood that to form the convex portion 568 instead of the grooves 563 in the top end can save cost and time for manufacturing the lens 56.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED assembly comprising:
   an LED; and
   a lens covering on an outer periphery of the LED, wherein the LED has an LED chip and an encapsulant encapsulating the LED chip therein, the LED chip comprises a light emitting surface, the lens has a light output surface over the light emitting surface, the light output surface defines a plurality of annular, concentric grooves each of which extends along a circumferential direction of the light output surface, each groove being cooperatively enclosed by an upper groove wall and a lower groove wall, the upper groove wall being a portion of a periphery of an imaginary cone, a conical tip of the imaginary cone being located on the light emitting surface of the LED chip, light emitted from the LED chip being upwardly dispersed out of the light output surface which includes a top end of an upper portion of the lens.

2. The LED assembly as claimed in claim 1, wherein the conical tip of the cone is located at a central point of the light emitting surface.

3. The LED assembly as claimed in claim 1, wherein a concave portion is defined in the top end of the upper portion of the lens, the concave portion has a smooth, continual surface which is curved downwardly.

4. The LED assembly as claimed in claim 1, wherein an axial section of the lower groove wall of the groove has one of the following configurations: convex, concave and straight.

5. The LED assembly as claimed in claim 1, wherein axial sections of the lower groove walls of the grooves have three kinds of configurations in following order along a radially outward direction: straight, convex and concave.

6. A lens for conducting light generated by a light emitting device which has a light emitting element and an encapsulant encapsulating the light emitting element therein, the lens comprising:
   a cylindrical lower portion and a dome-shaped upper portion on the lower portion, the dome-shaped upper portion defining a light output surface from which the light entering into the lens leaves the lens, the light output surface defining a plurality of annular, concentric grooves therein, wherein
   each of the grooves extends along a circumferential direction of the light output surface, each groove being cooperatively enclosed by an upper groove wall and a lower groove wall, the upper groove wall being a portion of a periphery of an imaginary cone, all of the conical tips of the imaginary cones corresponding to the grooves are located on a light emitting surface of the light emitting element, light generated by the light emitting element is upwardly dispersed out of the light output surface which includes a top end of the dome-shaped upper portion of the lens.

7. The lens as claimed in claim 6, wherein a concave portion is defined in the top end of the dome-shaped upper portion, the concave portion has a smooth, continual surface which is curved downwardly.

8. The lens as claimed in claim 6, wherein an axial section of the lower groove wall of the groove has one of the following configurations: convex, concave and straight.

9. The lens as claimed in claim 6, wherein axial sections of the lower groove walls of the grooves have three kinds of configurations in following order along a radially outward direction: straight, convex and concave.

10. An LED assembly comprising:
    an LED; and
    a lens covering on an outer periphery of the LED, wherein the LED has an LED chip and an encapsulant encapsulating the LED therein, the LED chip comprises a light emitting surface, the lens has a light output surface over the light emitting surface, the light output surface defines a plurality of annular, concentric grooves each of which extends along a circumferential direction of the light output surface, each groove being cooperatively enclosed by an upper groove wall and a lower groove wall, the lower groove wall being a portion of a periphery of an imaginary cone, a conical tip of the imaginary cone being located on the light emitting surface of the LED chip, light emitted from the LED chip emits out of the light output surface and is upwardly and inwardly converged to a small light receiving surface, the light output surface includes a top end of an upper portion of the lens.

11. The LED assembly as claimed in claim 10, wherein a convex portion is formed in the top end of the upper portion of the lens, the convex portion has a smooth, continual surface which is curved upwardly.

12. The LED assembly as claimed in claim 10, wherein an axial section of the upper groove wall of the groove has one of the following configurations: convex, concave and straight.

13. The LED assembly as claimed in claim 10, wherein the conical tip of the cone is located at a central point of the light emitting surface.

* * * * *